(12) United States Patent
Bazarjani et al.

(10) Patent No.: US 8,698,139 B2
(45) Date of Patent: Apr. 15, 2014

(54) DIE-TO-DIE POWER CONSUMPTION OPTIMIZATION

(75) Inventors: Seyfollah Seyfollahi Bazarjani, San Diego, CA (US); Reza Jalilizeinali, Oceanside, CA (US)

(73) Assignee: QUALCOMM Incorporated, San Diego, CA (US)

( * ) Notice: Subject to any disclaimer, the term of this patent is extended or adjusted under 35 U.S.C. 154(b) by 633 days.

(21) Appl. No.: 12/277,614

(22) Filed: Nov. 25, 2008

(65) Prior Publication Data

US 2010/0127359 A1    May 27, 2010

(51) Int. Cl.
*H01L 23/58*    (2006.01)
(52) U.S. Cl.
USPC ............... 257/48; 257/E23.002; 361/111
(58) Field of Classification Search
USPC .......... 257/8, 203, E27.11, E23.085, 48, 659, 257/E21.499, E23.002; 361/56, 111, 207, 361/271; 324/765
See application file for complete search history.

(56) References Cited

U.S. PATENT DOCUMENTS

| | | | |
|---|---|---|---|
| 5,731,945 A * | 3/1998 | Bertin et al. | 361/111 |
| 5,807,791 A | 9/1998 | Bertin | |
| 6,303,996 B2 * | 10/2001 | Lin | 257/777 |
| 6,327,125 B1 * | 12/2001 | Colclaser et al. | 361/56 |
| 2007/0262305 A1 | 11/2007 | Adkisson | |
| 2008/0128690 A1 * | 6/2008 | Burnside et al. | 257/48 |

FOREIGN PATENT DOCUMENTS

GB    2370691    7/2002

OTHER PUBLICATIONS

International Search Report—PCT/US2009/065890, International Search Authority—European Patent Office Mar. 23, 2010.
Written Opinion—PCT/US2009/065890, International Search Authority—European Patent Office Mar. 23, 2010.

* cited by examiner

*Primary Examiner* — Vongsavanh Sengdara
(74) *Attorney, Agent, or Firm* — Michelle S. Gallardo

(57) ABSTRACT

Power consumption of electronic components is reduced, particularly in a multi-chip package. Embodiments reduce parasitic capacitance of a semiconductor chip by reducing ESD protection circuitry that is not needed during operation of the package. ESD protection circuitry would be operational during production and/or testing of the chip, but some circuitry would be disabled or removed prior to normal operation of the multi-chip package.

15 Claims, 4 Drawing Sheets

US 8,698,139 B2

DIE-TO-DIE POWER CONSUMPTION OPTIMIZATION

TECHNICAL FIELD

This application is related in general to multi-chip packages, and in specific to systems and methods of reducing and/or optimizing power consumption in multi-chip packages.

BACKGROUND

Many systems now use device packages that comprise multiple chips or dies mounted in a single package. Such packages are referred to as system-in-package (SiP) devices. FIG. 1 depicts a conventional arrangement of a SiP package 14. The package 14 comprises two chips 10 and 11. Each die 10, 11 may comprise one or more contacts 16 that connect the die 10, 11 to contacts 17 on the package 14, and then the exterior of the package 14. Each die 10, 11 may comprise one or more die-to-die (D2D) connections 15 that connect the two die 10 and 11 with each other. Each die may have one or more contacts 12 and 13 for the D2D connections 15.

In general, chips are very susceptible to damage or destruction from electrostatic discharge (ESD). ESD occurs when there is a voltage difference between the chip and another object that is brought into contact with the chip. The voltage difference results in a high voltage discharge that damages the circuits on the chip. Since a layer of glass conventionally covers the active areas of the chip, the discharge conventionally enters the chip through the contacts 12, 13, 16.

Consequently, each of the contacts 12, 13, 16 is conventionally protected with one or more ESD protection circuits. Examples of such circuits are shown in FIGS. 2A and 2B.

FIG. 2A depicts a conventional output contact 12 and its related circuitry. Both the contact and its circuitry are located on the die 10. The contact pad 12 is connected to driver 20 that provides the signal that is to be sent out over the contact 12. Paired diodes 21 comprise the ESD circuit that is used to shunt a voltage discharge. For example, the diodes 21 may protect against human body model (HBM) type discharges. HBM type discharges are discharges caused by contact with a human.

FIG. 2B depicts a conventional input contact 13 and its related circuitry. Both the contact 13 and its circuitry are located on the die 11. The contact pad 13 is connected to input receiver 20 that provides the signal that is to be used inside of die 11. Paired diodes 21 and 23 comprise the primary ESD circuits that are used to shunt a voltage discharge. For example, diodes 21 may protect against primary discharge events, such as human body model (HBM) type discharges. Furthermore, diodes 23 serve as secondary protection circuitry, and may protect against secondary discharge events, such as charge device model (CDM) type discharges. CDM type discharges result from contact with another electronic device. Note that the resistor 22 is part of the secondary protection circuitry and limits current.

BRIEF SUMMARY

Various embodiments as described herein may be used to improve the operations of electronic devices. Devices, systems, and methods described herein may lead to improved power consumption of electronic devices.

One example embodiment is a semiconductor wafer that comprises at least one chip; and at least one electrostatic discharge (ESD) circuit associated with the chip. The ESD circuit is operable to protect the chip from an ESD event only during fabrication, and/or testing of the chip.

In another embodiment, a semiconductor wafer includes at least one chip, and at least one electrostatic discharge (ESD) circuit located on the chip. The ESD circuit is operable to protect the chip from an ESD event only during fabrication and/or testing of the chip. The wafer also includes at least one switch that disables the ESD circuit subsequent to fabrication of the chip.

Another example embodiment is a multi-chip package having a chip with a first port for handling an electrical signal, and an electrical path that is associated with the first port; and a second chip having a second port for handling the electrical signal. The first port and the second port are connected to each other to form a die-to-die connection within the package. The electrical path was connected to an ESD circuit such that the ESD circuit was operable to protect the first chip only during fabrication, and/or testing of the first chip and is not operable with the first chip residing in the package.

A further example embodiment is a process for forming an electronic device that comprises forming a chip on a wafer; forming an ESD circuit on the wafer that is electrically connected to a portion of the chip; maintaining the electrical connection between the chip and the ESD circuit for a portion of the process; and cutting the electrical connection prior to placing the chip in a package to form the electronic device.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION

Figure 1:
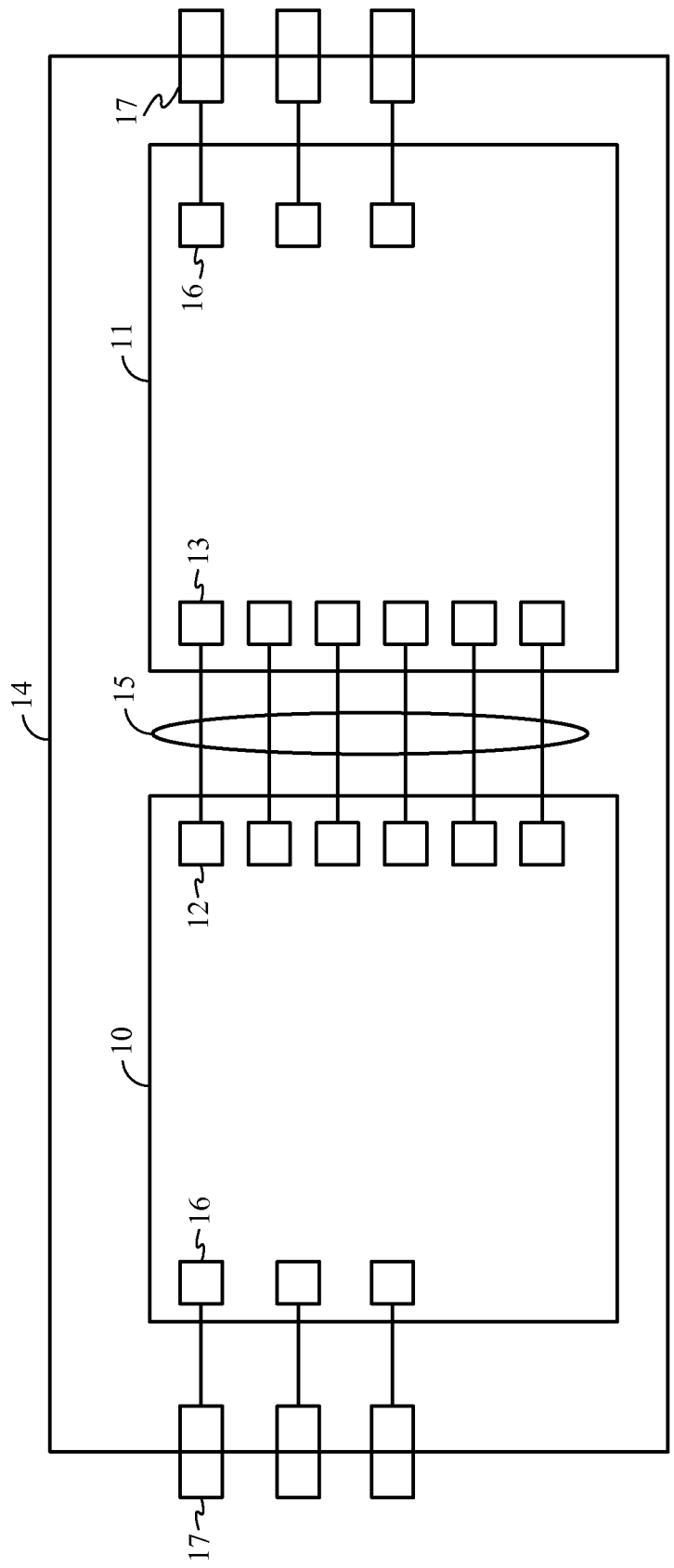
FIG. 1 is a blocked diagram depicting a conventional arrangement of a SiP package.
Figure 2A:
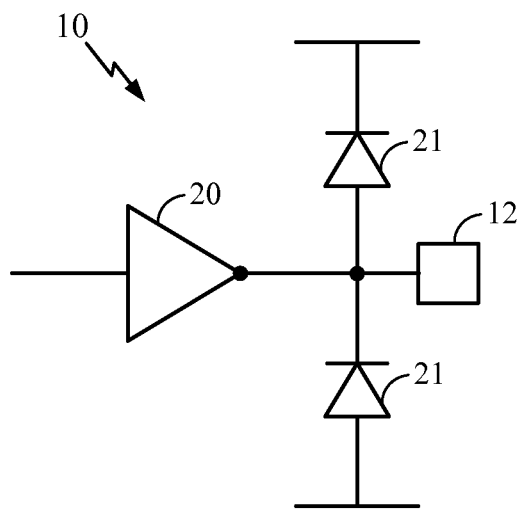
FIGS. 2A and 2B are circuit diagrams depicting exemplary contact pads and their associated circuitry of the package of FIG. 1.
Figure 2B:
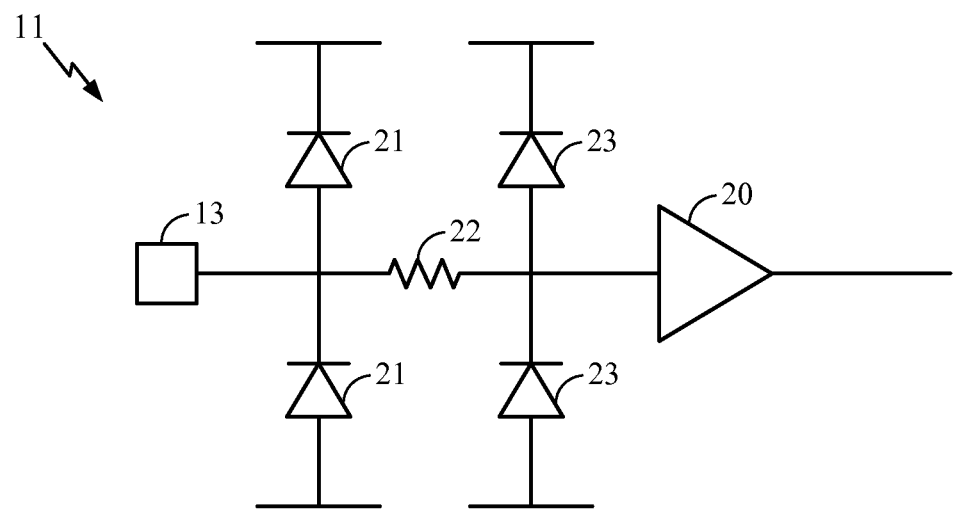

Embodiments described herein involve reducing and/or optimizing power consumption in multi-chip packages, e.g., system in package (SiP) packages. The multi-chip packages may include through-silicon-stacked (TSS) packages and stacked die. The multi-chip package may include all analog/RF chips, all digital chips, and/or a combination of one or more analog/RF chips and one or more digital chips.

Embodiments described herein note that the ESD protection circuitry can consume significant amounts of power because of the parasitic capacitance imposed on the SiP package from the ESD protection circuitry. The power consumed by parasitic capacitance of ESD protection circuitry may be approximated by $P \sim fCV^2$, where f is the frequency or clock rate, C is the parasitic capacitance, and V is the voltage. Thus, reducing the capacitance will reduce the power consumption.

Embodiments described herein may be used in any electronic device, but are particularly useful in portable devices that use a battery for power. A reduction in power consumption will increase the operational time of the device before a recharge or battery replacement is needed. Such portable devices may include telephones, music/video players, portable computers, personal data assistant devices, hand-held diagnostic equipment, e-mail receivers, data recorders, game devices, or cameras.

Embodiments described herein note that some contacts, for example, die-to-die (D2D) contacts, will likely not be touched by humans, and thus do not use HBM type ESD protection when in a completed package. In other words, because the D2D contacts are not exposed to the outside world after packaging, HBM and/or CDM ESD will likely not occur on the D2D contacts. Embodiments described herein note that some contacts, for example D2D contacts, do not use ESD protection beyond intermediate device production/testing. In other words, some contacts do not use any ESD protection, either HBM or CDM types, during normal operation of the SiP package, but would only use CDM type ESD protection during production, e.g. wafer test or other testing procedures.

Embodiments described herein may not use HBM type ESD protection for one or more D2D contacts. Other embodiments may use minimal HBM type ESD protection for one or more D2D contacts, e.g. by reducing the size of the HBM diodes that would be conventionally used.

Embodiments described herein provide certain types of ESD protection until singulation of the die, at which time the ESD protection changes. One embodiment uses gates or switches to control the availability of ESD protection. During some production or fabrication steps, e.g. wafer testing or other times when the contact is exposed, the ESD protection may be connected to a test pad via one or more switches. During normal operation of the completed package, the one or more gates may switch the ESD protection out of connection with the test pad. One arrangement is to have multiple contact pads, with one pad being used for probing and having associated ESD protection, and another pad being used for SiP package operation. The switches would control which pad is connected to the die, and thus operational. Another arrangement is to have the switches located between the ESD diodes and the contact. During production, the switches would connect the ESD diodes with the contact. During operation, the switches would disconnect the ESD diodes from the contact.

Note that some embodiments use a larger driver in the production contact pad path, and a smaller driver in the operations contact pad path. During testing, when an ESD event is most likely and the primary diodes are connected (primary diodes are larger than the secondary diodes), large drivers operate. After testing, and when the circuitry is not exposed, the switches are switched so that small drivers operate, and the primary diodes are off. Thus, less drive voltage is needed saving power. Note that the secondary diodes and the resistor, if present, are on the same path. Only the primary diodes should be switched on or off.

Other embodiments provide ESD protection during production of the package while placing some or all of the ESD protection on a portion of the wafer that will be separated from the chip during production. For example, the ESD protection may be placed in the scribe lane or saw street of the wafer. Thus, the ESD protection is available during production of the chip while the chip is a part of the wafer. One of the last production steps is to cut the chip from the wafer, at which time the ESD protection is cut away from the chip.

Other embodiments may use combinations of all or some of the embodiments described herein to reduce the power consumption of the SiP package. Embodiments described herein recognize that it may be beneficial to maintain some ESD protection, even for D2D contacts. Thus, some embodiments may be used to reduce the ESD protection during operation of the SiP, rather than completely remove it. For example, the switch may switch from larger ESD protection during production to a lesser amount during operation. Similarly, some ESD protection may be located in the scribe lane, while other ESD protection remains on chip. Thus, this will reduce power consumption without affecting device yield, and therefore optimize power consumption.

Figure 3:
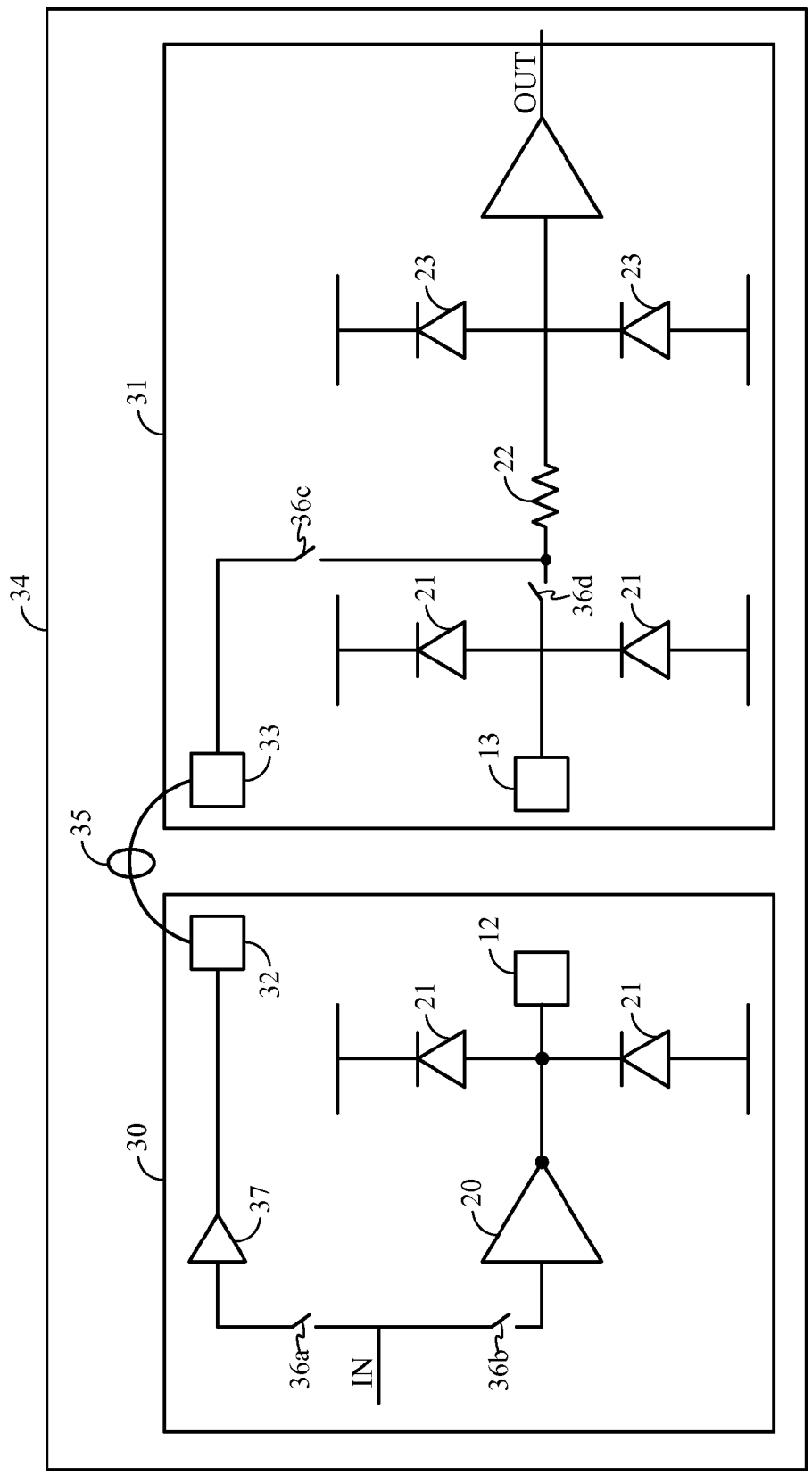
FIG. 3 depicts an arrangement of chips that reduces power consumption during operation of the chips, according to embodiments of the invention.

FIG. 3 depicts an arrangement of chips that reduces power consumption during operation of the chips. In this arrangement, each chip 30, 31 has one or more D2D contacts comprising two contact pads, one pad 12, 13 used during production/probing of the chip, and the second pad 32, 33 used during operation of the chip.

In the chip 30, switches 36a and 36b are used to connect the proper contact to the remainder of the chip. As shown, the remainder of the chip is an IN port that either sends or receives a signal, either power or data, to or from the chip 30. Note that the switches may comprise active elements (e.g. logic gates or transistors), or passive elements (e.g. connections configured to break). Similarly, the chip 31 includes switches 36a and 36b to connect the proper contact to the remainder of the chip.

Note that in this arrangement, the chip 30 also includes a second driver 37. The second driver may use less power and/or may have less capacitance than the driver 20. In some instances, a smaller driver may be needed for operation, while a larger driver may be needed for production/probing (e.g., testing). Note that this is by way of example only, as the chip 30 may have only a single driver. For such an arrangement, the switches 36a, 36b would be located between the driver 20 and the contacts 32 and 12, similar to what is shown in the chip 31.

Also note that in this arrangement, the chip 31 has some ESD protection during operation for illustrative purposes. Thus, during production/probing (or testing), the chip 31 would have ESD protection from both the primary circuit 21 and secondary protection 23, as well as the resistor 22. During operation, the primary circuit 21 is effectively switched off by opening the switch 36d and closing the switch 36c, leaving the secondary circuit 23 and resistor 22 to provide ESD protection for the chip 31. Consequently, during operation a lesser amount of ESD protection is required, and thus by using a lesser amount of ESD protection, the capacitance of the die 31 is reduced. Similarly, during operation of the chip 30, the circuit 21 and the large driver 20 are effectively switched off by opening the switch 36b and closing the switch 36a, reducing capacitance and power drain of the die 30.

Note that in this arrangement, all of the primary (e.g., HBM) ESD protection may have been removed from the D2D connections. Thus, the circuit 23 may be of the secondary (e.g., CDM) ESD type.

Figure 4A:
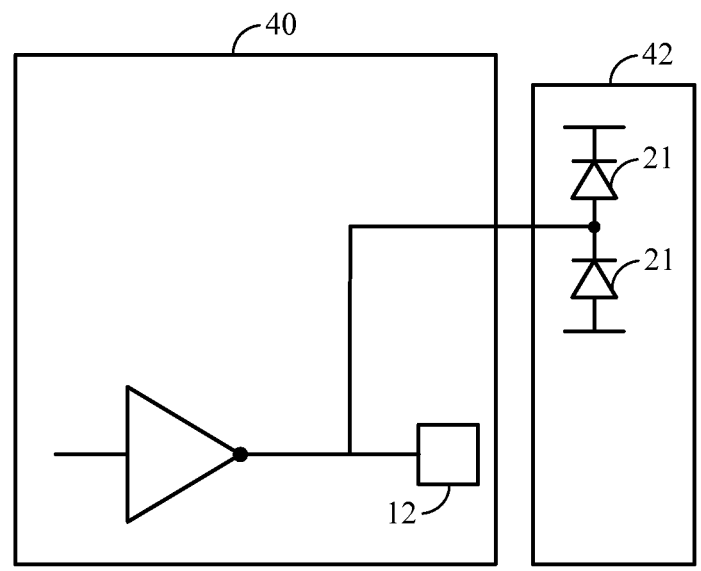
FIGS. 4A and 4B depict other arrangements for chips that reduce power consumption during operation of the chips, according to embodiments of the invention.
Figure 4B:
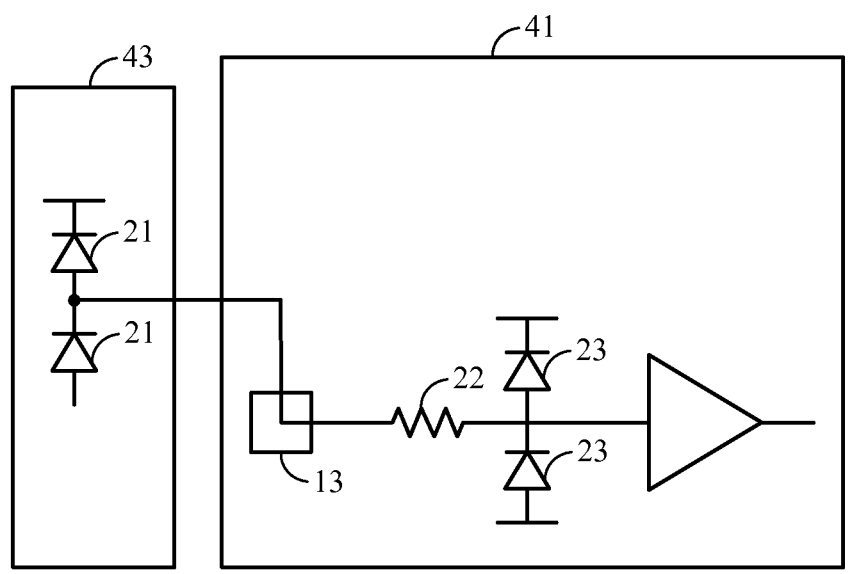

FIGS. 4A and 4B depict other arrangements for chips that reduce power consumption during operation of the chips. In FIG. 4A, the chip 40 has one or more contacts 12 that includes ESD protection circuitry 21 that is located in the scribe lane or saw street 42 of the wafer upon which the chip 40 is formed. During production/probing of the chip 40, while still a part of the wafer, the ESD protection circuitry is operable to protect the chip 40 from an ESD event. Thus, the chip may be processed, handled, and/or tested with the chip 40 being protected against ESD discharges from entering through the contact 12. When the chip 40 has been separated from the wafer, connection with the ESD protection circuitry 21 will have been cut, and thus during operation, the chip 40 will not suffer the capacitance and associated power drain of the circuitry 21. The design/layout should account for imprecise cutting that may short signals during cutting.

In FIG. 4B, the chip 41 has one or more contacts 13 that includes the ESD protection circuitry 21 located in the scribe lane or saw street 43 of the wafer upon which the chip 41 is formed. Also note that in this arrangement, the chip 41 has some ESD protection 22, 23 during operation for illustrative purposes. Thus, during production/probing (or testing), the chip 41 would have ESD protection from the circuits 21, 22, and 23. During operation, the circuit 21 is cut away, leaving the circuits 22 and 23 to provide ESD protection for the chip 41. Consequently, during operation a lesser amount of ESD protection is used, and thus the capacitance of the chip is reduced.

Note that in this arrangement, all of the primary (HBM) ESD protection may have been removed from the D2D connections. Thus, the circuit 23 may be of the secondary (CDM) ESD type. Other embodiments may use a reduced amount of primary (HBM) type ESD protection.

Another embodiment may have ESD circuitry located in one or more waste portions of the wafer. Thus, while not located in the scribe lane, the ESD circuitry will still be separated from the chip during the die cut portion of the production process.

Note that the embodiments have been depicted using paired diodes as the ESD circuit, however the embodiments described herein will operate with any type of ESD circuit, including those types that have a parasitic capacitance.

Further note that the embodiments have been described being associated with ESD circuits having a parasitic capacitance, however, the embodiments described herein will operate for any type of power draining ESD circuit.

The embodiments have been described being associated with ESD circuits, however, the embodiments described herein will operate for any type of power draining circuit, or other circuit that is needed for a portion of the fabrication process, but is not needed for normal operations of a packaged device.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

The invention claimed is:

1. A semiconductor apparatus comprising:
   a first chip coupled to a second chip;
   a primary electrostatic discharge (ESD) protection circuit having a portion located on the first chip and the second chip; and
   a secondary electrostatic discharge (ESD) protection circuit having a portion located on the first chip and the second chip;
   a first electrical path that includes the primary ESD protection circuit and a first driver;
   a second electrical path that includes the secondary ESD protection circuit and a second driver different from the first driver; and
   at least one switch operable to couple the first electrical path to an input during fabrication of the first and second chips and operable to couple the second electrical path to the input subsequent to fabrication of the first and second chips.

2. The semiconductor apparatus of claim 1, wherein the primary ESD protection circuit is inoperable during normal operations of the chips to reduce parasitic capacitance of the chips during the normal operations, and thereby reduce power consumption of the chips.

3. The semiconductor apparatus of claim 1, wherein the primary ESD protection circuit is designed for primary type discharge events.

4. The semiconductor apparatus of claim 1, wherein the chips are to reside within a single package.

5. The semiconductor apparatus of claim 4, wherein the package is selected from the group consisting of:
   a through-silicon stacked (TSS) package, a system in a package (SiP), and a stacked die package.

6. The semiconductor apparatus of claim 1,
   in which the at least one switch is operable to disable the primary ESD protection circuit subsequent to fabrication of a die package.

7. The semiconductor apparatus of claim 6, wherein the switch is selected from the group consisting of:
   at least one logic gate, at least one active element, and at least one passive element.

8. The semiconductor apparatus of claim 6, wherein the primary ESD circuit is inoperable during normal operations of the chips to reduce parasitic capacitance of the chips during the normal operations, and thereby reduce power consumption of the chips.

9. The semiconductor apparatus of claim 6, wherein the primary ESD protection circuit is designed for charged device model (CDM) type discharge events.

10. The semiconductor apparatus of claim 1, wherein the second electrical path has less parasitic capacitance than the first electrical path.

11. The semiconductor apparatus of claim 1, wherein the first electrical path includes a first contact pad, and the second electrical path includes a second contact pad different from the first contact pad.

12. The semiconductor apparatus of claim 1, wherein the first driver consumes more power than the second driver.

13. A multi-chip package comprising:
- a first chip coupled to a second chip;
- a primary electrostatic discharge (ESD) protection means having a portion located on each of the first chip and the second chip, the first primary ESD protection means being operable to protect the chips only during fabrication and/or testing of the chips;
- a secondary electrostatic discharge (ESD) protection means having a portion located on each of the first chip and second chip, the secondary ESD protection means being operable to protect the chips from an ESD event during operation of the chips;
- a first electrical path that includes the primary ESD protection means and a first driver;
- a second electrical path that includes the secondary ESD protection means and a second driver different from the first driver;
- a switching means for coupling the first electrical path to an input during fabrication of the first and second chips and for coupling the second electrical path to the input subsequent to fabrication of the first and second chips.

14. The multi-chip package of claim 13, in which the first driver uses more power than the second driver.

15. The multi-chip package of claim 13, in which the switching means is further configured for disabling the primary ESD protection circuit subsequent to fabrication of a die package.

* * * * *